United States Patent [19]

Kroebel Nieto et al.

[11] Patent Number: 5,601,227

[45] Date of Patent: Feb. 11, 1997

[54] PROCESS FOR THE PRODUCTION OF SERVICE BOXES

[75] Inventors: Rodolfo Kroebel Nieto; Josep Ma Altes Balaña, both of Valls, Spain

[73] Assignee: Mecanismos Auxiliares Industriales, S.A. M.A.I.S.A., Valls, Spain

[21] Appl. No.: 322,344

[22] Filed: Oct. 13, 1994

[30] Foreign Application Priority Data

Oct. 13, 1993 [ES] Spain ................................. 9302193

[51] Int. Cl.⁶ ........................................... H05K 3/28
[52] U.S. Cl. ............................. 228/180.1; 228/214
[58] Field of Search ........................... 228/254, 214, 228/262.9, 180.1; 174/256, 258

[56] References Cited

U.S. PATENT DOCUMENTS

| | | | |
|---|---|---|---|
| Re. 29,563 | 3/1978 | Manko | 228/262.9 |
| 3,894,330 | 7/1975 | Bellis | 228/254 |
| 3,895,158 | 7/1975 | Gause et al. | 174/258 |
| 4,789,620 | 12/1968 | Sasaki et al. | 522/103 X |
| 5,043,221 | 8/1991 | Koleske | 174/256 X |

FOREIGN PATENT DOCUMENTS

| | | |
|---|---|---|
| 2263817 | 8/1993 | European Pat. Off. |
| 228789 | 7/1977 | Spain . |
| 239279 | 11/1978 | Spain . |
| 533433 | 6/1984 | Spain . |
| 534841 | 7/1984 | Spain . |
| 9001544 | 5/1990 | Spain . |

*Primary Examiner*—Kenneth J. Ramsey
*Attorney, Agent, or Firm*—Jacobson, Price, Holman & Stern, PLLC

[57] ABSTRACT

Special alloys of the kind responding to the formula of 95% Sn 5% Sb or 52% Sn 45% Pb 3% Sb having a melting point greater than 183° C. are used in one of the preferred embodiments of the invention within this application as a first improvement in the welding of printed circuit boards. These alloys improve the quality of welding, as well as its influence on the long-term running of a service box, to the same as the life span of a car.

2 Claims, 5 Drawing Sheets

PROCESS FOR THE PRODUCTION OF SERVICE BOXES

FIELD OF THE INVENTION

The present invention relates to improvements of welding operations in printed circuit boards.

BACKGROUND OF THE INVENTION

Published UK Patent Application No. GB 2263817A concerns a process for the production of service boxes and their parts having new construction characteristics, format and design which fulfill the purpose for which they were specifically conceived with maximum safety and efficiency.

A service box for cars is a central mechanism of an electrical connection system in the vehicle. This service box acts as a support for protection equipment (fuses) as well as for various electrical components, such as relays, diodes, electronic control modules and connectors.

All the connections of the above mentioned components are effected in the box by means of one or various printed circuit boards (PCB's). The circuit boards and the terminals are covered with plastic which protects and secures them. The service boxes act as connection centers, grouping together the electrical and electronic connections, and are capable of distributing power and control signals to and from the various parts of the vehicle.

Certain aspects of the boxes referred to in the production process below have been described in Spanish Model No. 228,789 entitled "Electronic distribution box for cars", Spanish Model No. 239.279 "Perfected Electrical Distribution Block", Spanish Invention Patent No. 533.433 "Perfected procedure for the production of electrical distribution boxes", additional Spanish certificate No. 534.841 "Improvements in Invention Patent No. 533.433" and finally, Spanish Invention Patent No. 9001544 "Perfections to production procedure for electrical distribution boxes."

The above-mentioned documents contain some of the improvements applicable to electrical distribution boxes and the objective of UK Patent Application No. GB 2263817A is to amalgamate the improvements contained in the previous proposals into one construction which would embody the various parts and processes concerned in the production of these service boxes.

The service boxes are connected to the exterior by means of interconnections, which are metal parts embedded in copper and attached by solder. The main advantage of each new product (i.e. service box) lies in the versatility of its design, which allows adjustments or increase of function at low cost.

Amongst other advantages, these improvements, details of which are given below, include PCB technology, enabling:

a) Less weight than the traditional system b) Less volume than the traditional system c) Decrease in cost compared to present cable system d) Easy assembly of service box in vehicle e) Prevention of connection errors f) Access to both the user and mechanic g) Safe connections The object of UK Patent Application No. GB 2263817A is to incorporate the improvements of the previous Spanish patents, together with the various parts comprising a general non-specific service box. The product or the service box is created in the design phase and produced according to the customer's requirements, adapting it to the technology described, which is common to all boxes.

With this object in mind, UK Patent Application No. GB 2263817A provides a process for the production of service boxes comprised of a set of PCB's to which have been inserted and soldered the corresponding electrical components, and characterized in that the production process includes at least some of the following steps: printing of components, soldering of components, insertion of bridges, insertion of short pins and long pins, checking of plane circuits, angling of PCB's by milling of bases, "sewing" of PCB's along perimeter edges, assembly of covers and fuses, final checking, encasing.

The production process for service boxes begins with the study of the product, paying special attention to technical and dimensional requirements of the customer. At this first stage, the printed circuit begins to take shape—whether on a multiple board, double sided, angled or otherwise—together with the plastic parts which serve to assemble, seal, attach and separate the boards. The external assemblies in the box, such as connectors, fuses and relays, are also examined at this stage.

The production of the PCB starts from a base with a conducting lamina, generally copper, on top. The base used is normally paper with phenol resins, called FR-2, although FR-4 (glass fibre with epoxy resin) can also be used for car service boxes. The conducting material is chosen for its thickness, depending on the amperage it must withstand; thicknesses up to 400 mm are commonly used.

An anti-solder film or varnish is then applied to the conducting material; the edges of the conduction strips are also oxidized for this purpose, as the anti-rust film does not reach them.

Electrical connectivity between the two sides of the circuit board is achieved by means of a short pin. Several layers joined together (a multiple board), which may be either single or double sided, are used to form service boxes. The boards are mechanically joined together by long pins, which also form an electrical connection. Four sides, each of copper, can then be connected by means of the long pins (two sides of one board connected to one of the other, the four sides together, or one of one board to one of the other).

The long pins are positioned around the external perimeter of the boards to achieve good mechanical connection, hence the insertion of these long pins is known as "sewing".

It is also possible for reasons of volume to use an angled circuit, so that less volume is occupied using the same surface. In this way, PCB's angled at 90°, 45° and even 180° are possible.

The plastic parts used are designed according to the requirements of the customer and the design of the PCB. The main plastic parts are the plastic supports (basically for fuses, connectors and relays).

The function of the plastic parts is to give mechanical support to the connections, relays and fuses and also to house the PCB, as described below. For a service box to be operative it must be set into the vehicle using screws, which go directly into the body work, or to feed through screws or suitable clips.

Separators are also used in the assembly for PCB's in the service box. Their purpose is to provide electronic insulation between opposing strips of multiple board PCB's.

To house relays, fuses and connections each plastic support must be designed so that the corresponding component fits into its housing. In this way a box is designed to provide a housing for fuses, connectors, relays and the extracting pincer.

The components of the PCB normally used in the recommended production processes are sockets. These are embedded in the board, and are pincer shaped. They generally hold the tab of a fuse, relay or other component, thus making an electrical connection. The tabs are components inserted into the board which act as an interconnection with the exterior, they are normally wide and long with respect to their depth. A group of tabs will form an external connection support socket. Bridges are mechanisms for connecting support sockets and for connecting strips of a PCB, when it is impossible to make the same union using the strips themselves due to shortage of space.

Jumpers are also used and have the same function as a bridge, as previously described, but join strips which are angled at 45°, 90° and 180°. They are soldered on the side in which they are inserted and do not cross the base.

Another element used is a busber, which is any type of bridge inserted into the PCB when it is not possible to use the conventional bridge described above, whether due to electrical reasons or because of electrical requirements. Finally, conducting screws are also used, their geometry and function will depend on what purpose they are required for.

Figure 1:
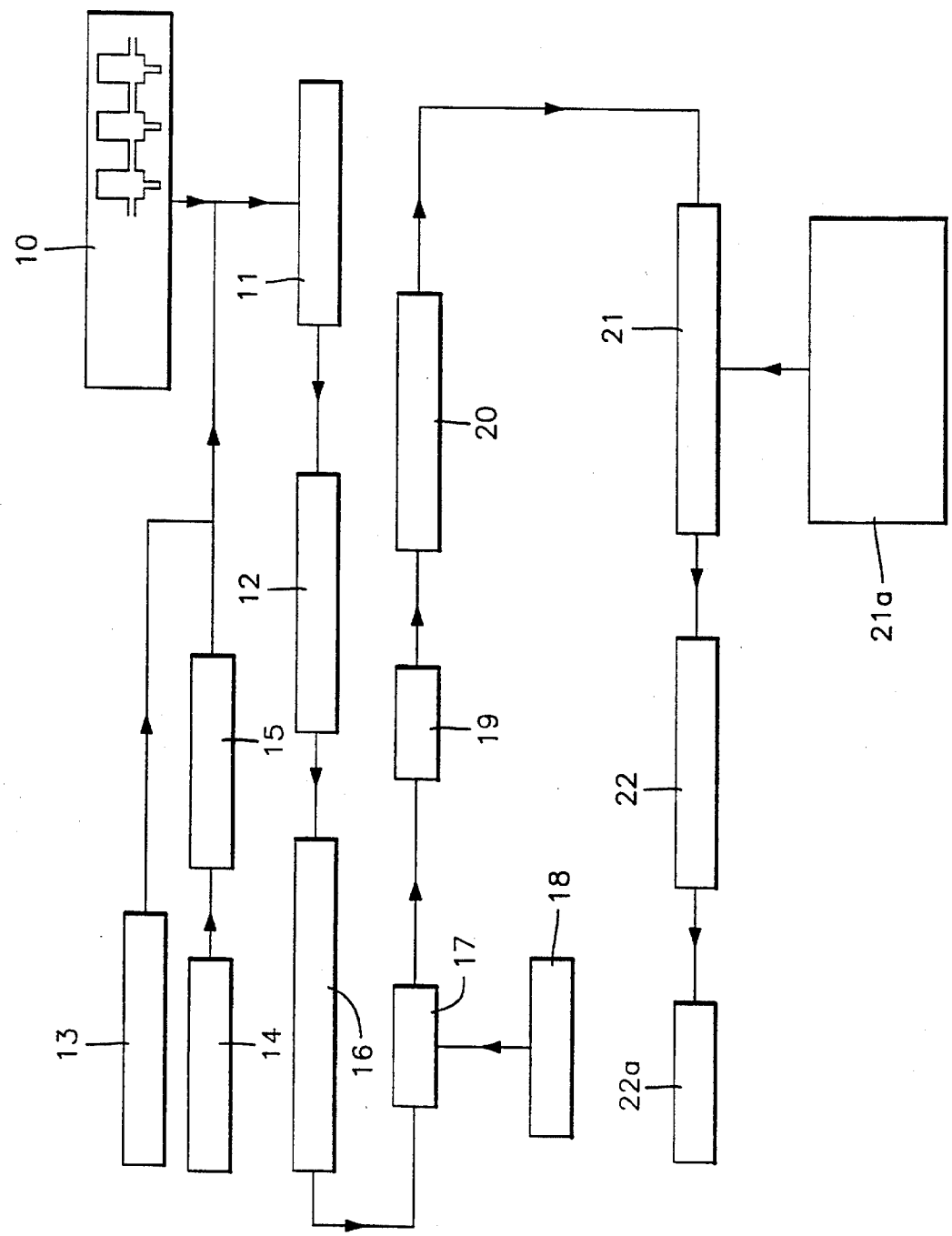
FIG. 1 shows a diagram of the production process for service boxes.

A detailed summary of the various elements of U.K. Patent Application No. 2263817A is given below: (10) printing; (11) and (12) soldering components; (13) insertion bridges; (14) insertion pins; (15) soldering pins; (16) checking of plane circuit; (17) angling; (18) positioning of separators; (19) "sewing"; (20) lateral soldering; (21) fuse and cover assembly; (21a) fuse support covers; (21c) connect support cover assembly; (22) final check; (22a) encasing; (23) base; (24) copper conducting lamina; (24a) area near pin; (24b) area near component; (25) short pin; (26) long pin; (27) connector supports; (27a) partitions; (29) service box; (30) tabs; (31) PCB; (32) sockets; (33) cavities; (34) cavities; (38) arms; (39) fuses; (41) fins; (41a) fin-tip; (42) bridges; (49) soldering material.

In one of the operations dealt with in this invention, the production process for a service box (29) with PCB's (31), angled or non-angled and sewn, will be composed of at least some of the following operations:

a) Cutting of short and long pins (25 and 26) to measure and machining of the ends from a continuous rod.

b) Cutting of bridges (42), angling of the elbow bends (42) and machining of their ends.

c) Insertion of short pins (25) or long pins (26) and bridges (42).

d) Soldering of pins (25 and 26) to PCB (31) by tin soldering.

e) Insertion of components such as tabs (30) and sockets (32).

f) Soldering of tabs and sockets (32).

g) Checking of plan circuit h) Angling of circuit (31), placing a separator in the middle.

i) "Sewing" by means of insertion of long pins (26) and subsequent angling.

j) Assembly of the injection-molded plastic covers for fuse and relay supports.

k) Assembly of the injection-molded plastic covers for fuse and relay supports.

l) Assembly of the fuses and final check.

The production process for a service box whose PCB is angled and "sewn" is carried out on a production line composed of computer-programmed automatic inserters for the different components, a transport line and automatic solderers together with an artificial vision system which detects the different colors of the fuses in their corresponding positions, the assembly line is subsequently electronically controlled, printing the reference number and date on the service box (29), if the part is correctly assembled, or automatically discarding any faulty part.

Soldering is carried out in the following way depending on the type of soldering used. For example:

Soldering by dip: the unsoldered PCB is firstly passed through the "fix" to eliminate all dirt on the copper and thus achieve a better solder. Subsequently the circuit enters a pre-heating area where the ambient temperature is approximately 400° in order to lessen the thermal shock which it will receive on contact with the tin and finally it is passed through the tin dip which is at a temperature of approximately 245° C., and the tin reaches the area to be soldered.

The whole process can be controlled by changing certain variables, such as velocity of the conveyor belt carrying the board or the level of the tin dip covering the areas to be soldered. 60–40% tin/lead should be used, i.e. 63% tin and 37% lead.

Figure 2A:
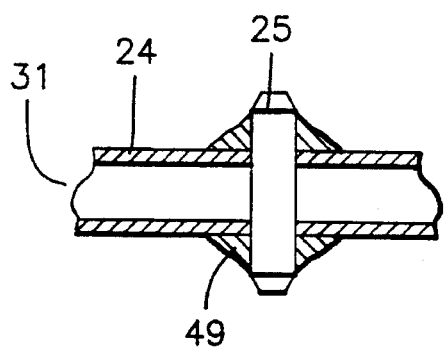
FIGS. 2A and 2B show elevations of a partial section of a PCB, in which a short pin and long pin have been placed.
Figure 2B:
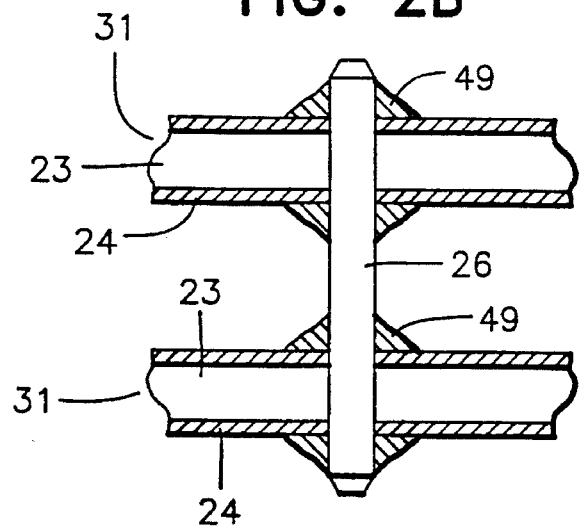

The principal operations forming part of the production process are described below, with reference to the corresponding figures. FIGS. 2A and 2B show a pin (25) on a PCB (31) with soldering material (49). The use of long pin (26) allows the electrical union of four sides of copper conducting part (24) which can be connected together, as required, by means of these long pins (26), with both sides of one board (31) connected to the copper conducting part (24) of the other board (31), the four conducting sides (24) connected together or one side (24) of one board (31) connected to one side (24) of the other.

Figure 3:
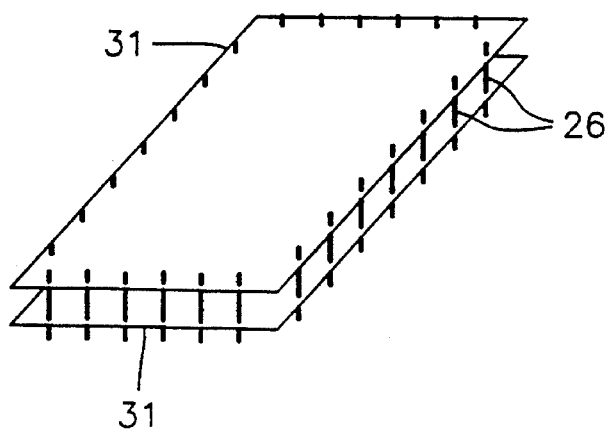
FIG. 3 shows a perspective of two PCB's joined by "sewing" of large pins around the perimeter.
Figure 4A:
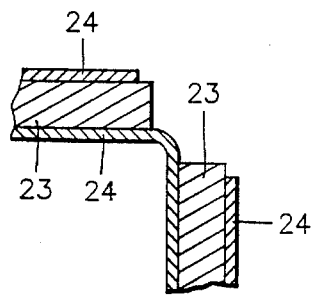
FIGS. 4A–4J show elevations of partial transverse sections of a series of PCB's, angled at right angles, acute angles, 180° and 45°.
Figure 4B:
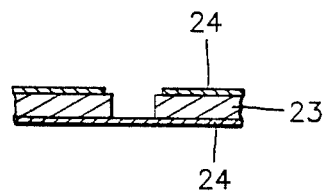
Figure 4C:
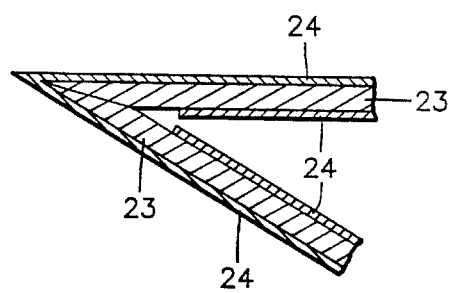
Figure 4D:
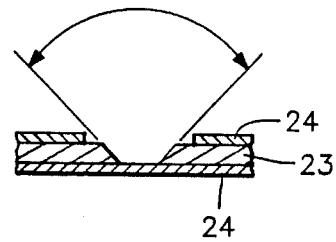
Figure 4E:
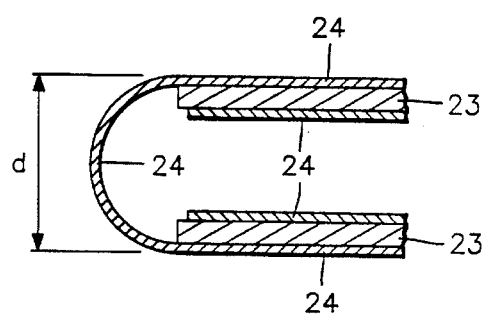
Figure 4F:
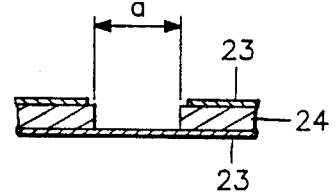
Figure 4G:
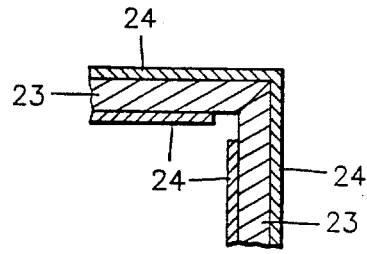
Figure 4H:
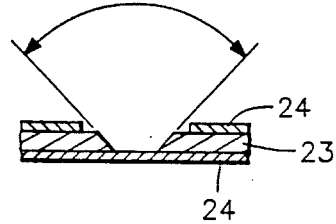
Figure 4I:
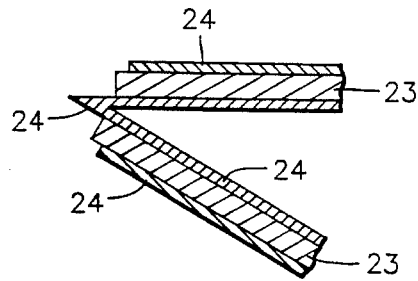
Figure 4J:
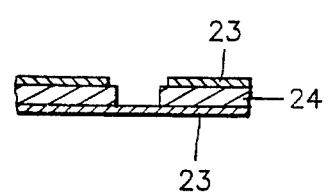

The positioning of the long pins (26) is carried out as shown in FIG. 3 along the whole perimeter of the PCB's (31), so that they have an adequate mechanical connection between them.

It is also possible due to space shortages to transform the boards (31) by angling them, so that the same working surface of the stripe occupies less volume or so that the boards can be adjusted to the exact shape required by the car manufacturer. The result is circuit boards (31) angled at 90°, 45° and even 180°.

As can be seen in FIG. 4 angling at 90° presents two possibilities: angling outwards or inwards, for which the base (23) is milled down accordingly, as shown in FIG. 4. Milling of the base varies according to the chosen angle (23). Milling at 90° produces a completely straight profile of the groove with parallel vertical sides, while in a different form of 90° angle milling creates sides which form an approximate 90° angle between them.

When angling is at 45° there are two possibilities: turning outwards or inwards. When angling is outwards, milling produces a groove with parallel vertical sides, while turning inwards produces a groove with sides which form an approximately 45° angle.

When angled at 180°, the distance between the two PCB's (31) is governed by the width of milling which should be twice the base width by TT.

It should be remembered that for all types of base angling (32), after milling the copper layer or conducting lamina (24) without cutting, a thin layer of base (23) should remain whose thickness will vary between 0.02 and 0.01 mm.

Another system used is angling and subsequent sewing through the edges which are not turned.

Figure 5:
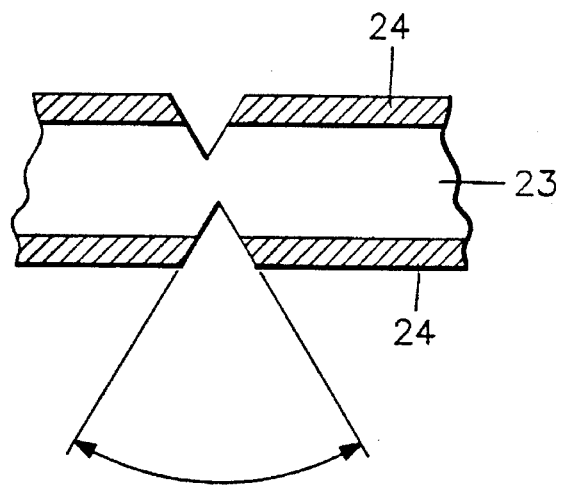
FIG. 5 shows an elevation of a partial longitudinal section of a PCB which has been milled to divide multiple boards into single boards.

When PCB's (31) are of smaller dimensions, they can be grouped on a board of greater size and insertion and soldering operations may be carried out as for only one board. To divide the multiple board into single boards, milling as shown in FIG. 5 is performed.

Figure 6:
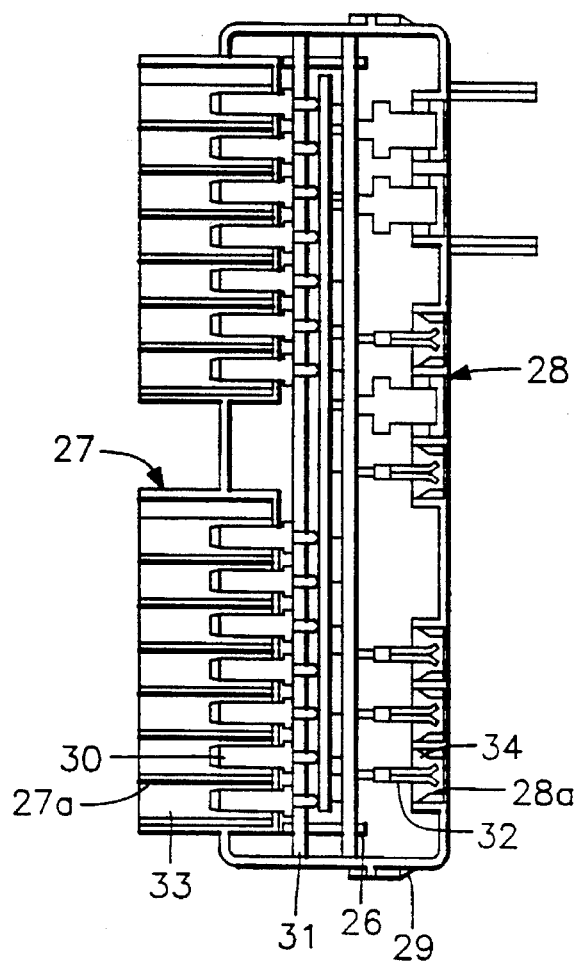
FIG. 6 shows an elevation of a longitudinal section of a service box which consists of a connector support and fuse support.
Figure 7A:
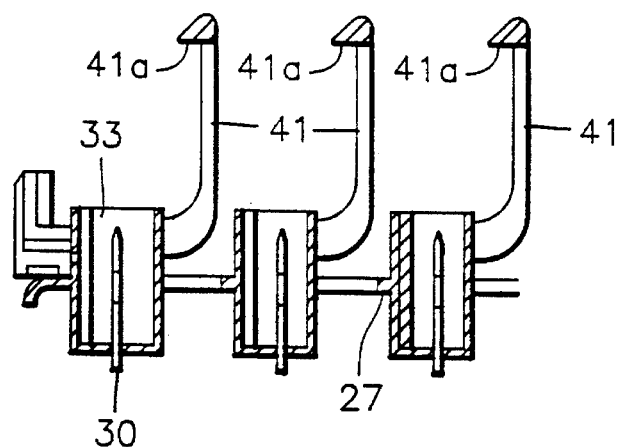
FIGS. 7A and 7B show a plan and elevation of a partial section of the connector fastening system for the connector support, after the tabs have been introduced.
Figure 7B:
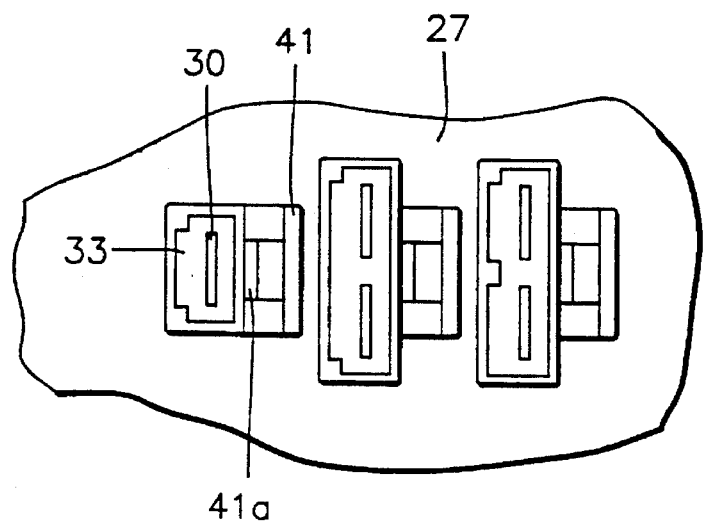
Figure 8:
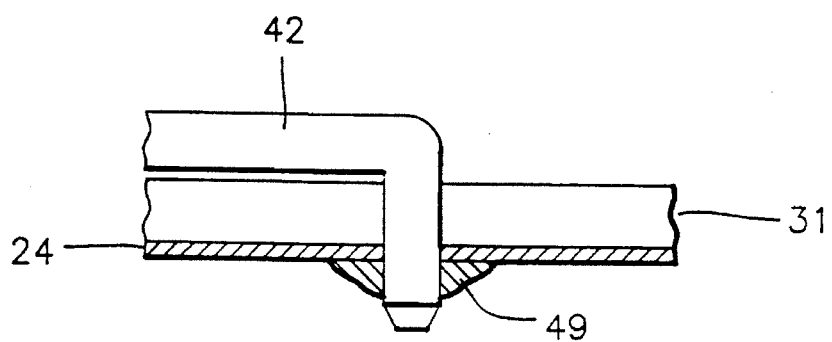
FIG. 8 shows an elevation of a longitudinal section of the PCB in which a bridge has been inserted.

Plastic parts, such as the connector support (27) and the fuse support (28), are designed according to the requirements of the customer, but generally they fit into each other with the PCB's held between them by short pins (25), long pins (26) or bridges (42) as shown in FIG. 6. Both sides of the conducting lamina (24) have sockets (32) and tabs (30) which are positioned inside the cavities and designed so that they act as an entrance guide for the corresponding fuses and connectors.

The connector attachment systems requires the support (27) to have fins (41) with fin-tips (41a). These fins are soldered to the walls of the cavities (33) as shown in FIG. 10, which shows the connector support (30) with several fins (41) and tabs (30). FIG. 10 also shows the connector support with connectors held by the fin-tip (41a).

Bridges (42) which are automatically produced are formed by tin and copper rods, which are firstly cut so as to make bridge heads with a truncated prism configuration at the elbow bends.

SUMMARY OF THE INVENTION

In a preferred embodiment of the invention, a series of improvements on welding operations in printed circuit boards are made, as well as their surface finish, with the aim of improving the quality of the service box and the manufacturing process itself.

Current welding processes use a tin-lead (60–40%) alloy for welding the side which contains the components and the other side of a service box. The present invention is based upon laboratory tests have been carried out in order to improve the quality of welding by using other alloys.

The printed circuit boards which have to be welded on both sides undergo a change during the second phase of welding. The dipping process and the composition of the tin dip must therefore be changed in order to improve the quality of the weld.

During the welding process, the printed circuit board is subjected to sudden changes in temperature, the reason being that a number of different temperatures come into play. Firstly during the welding process, the board is subjected to a temperature which is called preheating temperature, followed then by a temperature which is called welding-alloy temperature, the latter being finally followed by a cooling temperature, until the board, with its components already incorporated and welded, reaches room temperature. During these changes in temperature, the materials experience mechanical stresses which could affect the weld.

Another of the changes proposed by the present invention consists of changing the substrate material on the sides of the printed circuit boards in order to improve reheating of the boards, their bending when they leave the welding machines and the improvement of electrical insulation.

The substrates used until now, those of the FR-2 type, available from DINOL of Switzerland, show a series of limitations during manufacture of the service box, which in the interests of improved quality and finish of the circuits now leads to use a new type of substrate.

Finally, another feature of the improvements of the present invention is the use of a special varnish on the surfaces of the printed circuit board, on both sides. The aim behind this is to improve the quality of the board, increasing its insulating resistance in the spaces between tracks, which are called between-tracks.

Special alloys of the kind responding to formula 95% Sn 5% Sb and 52% Sn 45% Pb 3% Sb having a melting point greater than 183° C. will be used in one of the preferred embodiments of the invention within this application as a first improvement in the welding of the printed circuit boards. These alloys improve the quality of welding, as well as its influence on the long-term running of a service box, to the same as the life span of the car.

The advantages of using new alloys are shown by an improvement in the process, with the new alloy managing to bring about an increase in the shearing or tensile stress, from 5400 lb/in$^2$ to 6000 lb/in$^2$.

Other mechanical properties also increase, such as particle displacement in (%), which goes from 28% (with welding alloy of 60% Sn 40% Pb) to 38% (with a welding alloy of 95% Sn 5% Sb).

The second of the improvements of the present invention introduced is based around the application of a new substrate material called "CEM-1", available from DINOL of Switzerland, which is characterized by its being made up of glass fibers on the external surface and epoxy paper on the internal surface; this substrate has been established according to the National Electrical Manufacturer's Association NEMA-LI-1-1983 standard applicable to a base material or substrate for a printed circuit board, which gives the board new features, such as greater resistance to welding which goes from 10 seconds for the FR-2 substrate, to 20 seconds for the new CEM-1 substrate material; greater resistance to tearing of the track, which goes from a value of 6–7 in the FR-2 substrate used, to a value of 7–9 in the CEM-1 substrate; greater surface resistance, which goes from $10^3$ MΩ to $10^4$ MΩ, and finally a lower percentage of water absorption, which goes from 0.55 to 0.25.

The third improvement of the present invention consists in using a special varnish as well as a special substrate, such as CEM-1, with the aim of improving the insulation resistance as well as water absorption.

To date, two types of varnish have been tested with positive results:

Spray-projection of a liquid of photosensitive component which dries by evaporation.

Dinitrol 19 varnish available from DINOL of Switzerland, which is a water-repellent liquid and a protector against corrosion.

The photosensitive dip is a two component photosensitive liquid (varied) which dries by evaporation leaving its film with a gloss finish. This varnish must have the following properties:

* Resistance to welding.
* Resistance to most solvents.
* Good adhesion to copper.
* Inflammability.
* Good Insulating resistance.
* Resistance to moisture.
* Resistance to Electromigration.

These varnishes are epoxy-resin based.

Dinitrol 19 is a water-repellent liquid which releases a filter preventing corrosion. This liquid is based on a content of solid substances, dissolved in their own solvent, which is usually turpentine. When the solvent evaporates, a very thin (0.03 mm), completely transparent film remains on the printed circuit board, which has very good properties for preventing corrosion and absorbing moisture.

Having described the invention, many modifications thereto will become apparent to those skilled in the art to which it pertains without deviation from the spirit of the invention as defined by the scope of the appended claims.

I claim:

1. In a process of manufacture and welding of printed circuit boards, the improvement comprising
    welding a printed circuit board with an alloy of the formula 95% tin and 5% antimony having a melting point greater than 183° C., the printed circuit board being made of glass fiber on external surfaces and epoxy paper internally,
    applying a water-repellent liquid to the printed circuit board, said water-repellent liquid including a content of solid substances dissolved in turpentine, and
    evaporating the turpentine to form a completely transparent film on the printed circuit board of a thickness of 0.03 mm.

2. In a process of manufacture and welding of printed circuit boards, the improvement comprising welding a printed circuit board with an alloy of the formula 52% tin, 45% lead and 3% antimony having a melting point greater than 183° C., the printed circuit board being made of glass fiber on external surfaces and epoxy paper internally,
    applying a water-repellent liquid to the printed circuit board, said water-repellent liquid including a content of solid substances dissolved in turpentine, and
    evaporating the turpentine to form a completely transparent film on the printed circuit board of a thickness of 0.03 mm.

* * * * *